(12) United States Patent
Matsuda et al.

(10) Patent No.: US 8,421,111 B2
(45) Date of Patent: Apr. 16, 2013

(54) LIGHT-EMITTING DEVICE AND LAMP

(75) Inventors: Tsugihiro Matsuda, Kyoto (JP); Nobuyoshi Takeuchi, Osaka (JP); Hideo Nagai, Osaka (JP); Takaari Uemoto, Osaka (JP); Masahiro Miki, Osaka (JP); Atsushi Motoya, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/503,242

(22) PCT Filed: Aug. 23, 2011

(86) PCT No.: PCT/JP2011/004678
§ 371 (c)(1),
(2), (4) Date: Apr. 20, 2012

(65) Prior Publication Data
US 2012/0235181 A1  Sep. 20, 2012

(30) Foreign Application Priority Data
Dec. 27, 2010  (JP) .................. 2010-290928

(51) Int. Cl.
*H01L 33/00* (2010.01)
(52) U.S. Cl.
USPC .................. 257/98; 257/99; 257/100
(58) Field of Classification Search ............. 257/88–103
See application file for complete search history.

(56) References Cited

U.S. PATENT DOCUMENTS

| | | | |
|---|---|---|---|
| 7,084,435 B2 | 8/2006 | Sugimoto et al. | |
| 7,758,223 B2 | 7/2010 | Osawa et al. | |
| 2002/0021085 A1 | 2/2002 | Ng | |
| 2004/0190304 A1 | 9/2004 | Sugimoto et al. | |
| 2006/0175625 A1 | 8/2006 | Yokotani et al. | |
| 2006/0227558 A1 | 10/2006 | Osawa et al. | |
| 2007/0096140 A1 | 5/2007 | Sun | |
| 2007/0139949 A1 | 6/2007 | Tanda et al. | |
| 2010/0109551 A1 | 5/2010 | Shen | |
| 2010/0110157 A1* | 5/2010 | Yonehara et al. | 257/88 |
| 2010/0237761 A1 | 9/2010 | Osawa et al. | |
| 2010/0237779 A1 | 9/2010 | Osawa et al. | |
| 2010/0244650 A1 | 9/2010 | Osawa et al. | |
| 2010/0244694 A1 | 9/2010 | Osawa et al. | |

(Continued)

FOREIGN PATENT DOCUMENTS

| | | |
|---|---|---|
| EP | 2492978 | 8/2012 |
| JP | 2000-315824 | 11/2000 |

(Continued)

OTHER PUBLICATIONS

Search report from E.P.O., mail date is Oct. 25, 2012.

*Primary Examiner* — Cuong Q Nguyen
(74) *Attorney, Agent, or Firm* — Greenblum & Bernstein P.L.C.

(57) ABSTRACT

A light-emitting device including: a base which is translucent; a semiconductor light-emitting element provided on the base; a sealing member for sealing the semiconductor light-emitting element and including a first wavelength conversion material for converting a wavelength of light emitted by the semiconductor light-emitting element to a predetermined wavelength; and a groove provided on a side of the semiconductor light-emitting element, recessed from a top surface of the base on which the semiconductor light-emitting element is provided or a back surface of the base which is a surface opposite to the top surface, and for holding a second wavelength conversion material for converting the wavelength of the light emitted by the semiconductor light-emitting element to the predetermined wavelength.

9 Claims, 12 Drawing Sheets

U.S. PATENT DOCUMENTS

| | | |
|---|---|---|
| 2010/0253200 A1 | 10/2010 | Osawa et al. |
| 2011/0156569 A1 | 6/2011 | Osawa et al. |
| 2011/0309386 A1 | 12/2011 | Osawa et al. |
| 2011/0310606 A1 | 12/2011 | Osawa et al. |

FOREIGN PATENT DOCUMENTS

| | | |
|---|---|---|
| JP | 2003-110146 | 4/2003 |
| JP | 2006-313717 | 11/2006 |
| JP | 2007-123885 | 5/2007 |
| JP | 2008-066691 | 3/2008 |
| JP | 2009-043447 | 2/2009 |
| JP | 2010-141119 | 6/2010 |
| JP | 2010-229002 | 10/2010 |
| JP | 2010-283281 | 12/2010 |
| WO | 2012/095931 | 7/2012 |

* cited by examiner

LIGHT-EMITTING DEVICE AND LAMP

TECHNICAL FIELD

The present invention relates to a light-emitting device including a semiconductor light-emitting element and a lamp including the light-emitting device.

BACKGROUND ART

In recent years, semiconductor light-emitting elements such as light-emitting diode (LED) are considered as new light sources for lamps for their high efficiency and long lifetime, and research and development have been taking place on LED lamps having LEDs as the light source.

The LED lamps include an LED lamp having a shape of straight tube (straight-tube LED lamp) and an LED lamp having a shape of light bulb (light bulb shaped LED lamp). LED modules (light-emitting modules) each configured of LEDs mounted on a board are used for the lamps.

For example, the patent literature 1 discloses a conventional light bulb shaped LED lamp, for example. The patent literature 2 discloses a conventional straight-tube LED lamp.

CITATION LIST

[Patent Literature]
[Patent Literature 1] Japanese Unexamined Patent Application Publication No. 2006-313717
[Patent Literature 2] Japanese Unexamined Patent Application Publication No. 2009-043447

SUMMARY OF INVENTION

Technical Problem

In the conventional light bulb shaped LED lamp, a heat sink is used for radiating heat generated at the LED, and the LED module is fixed to the heat sink. For example, in the light bulb shaped LED lamp disclosed in the patent literature 1, a metal case which serves as the heat sink is provided between the semispherical globe and the base, and the LED module is fixed to the upper surface of the metal case.

A heat sink is also used in the straight-tube LED lamp in order to radiate heat generated at the LED. In this case, a long metal base made of aluminum, for example, is used as the heat sink. The metal base is bonded to the inner surface of the straight tube with adhesive, and the LED module is fixed to the upper surface of the metal base.

However, with the conventional light bulb shaped LED lamp and the straight-tube LED lamp, among the light emitted by the LED module, the light emitted toward the heat sink is blocked by the metal heat sink.

Consequently, the light emitted by the conventional LED lamp spreads differently from the light emitted by the conventional incandescent light bulb, the light bulb shaped fluorescent light, or the straight-tube fluorescent light having omnidirectional light distribution property. In other words, with the conventional light bulb shaped LED lamp and the straight-tube LED lamp, it is difficult to achieve the multidirectional light distribution property equivalent to that of the incandescent lamp and the existing light bulb shaped fluorescent lamp.

One way to address this problem is a light bulb shaped LED lamp having a configuration equivalent to that of the incandescent light bulb, for example. More specifically, with such a configuration, the light bulb shaped LED lamp has an LED module simply replacing the filament coil of the incandescent light bulb without using the heat sink. With this configuration, the light from the LED module is not blocked by the heat sink.

However, with the conventional light bulb shaped LED lamp and the straight-tube LED lamp, among the light emitted by the LED module, the light traveling toward the heat sink is blocked by the heat sink.

Thus, the LED module is configured such that the light emitted by the LED module does not travel toward the heat sink but to a side opposite to the heat sink. Stated differently, the conventional LED module is configured to emit light only from one side of the board on which the LEDs are mounted.

Accordingly, there is a problem that the multidirectional light distribution property is not achieved even when the LED module used for the conventional light bulb shaped LED lamp and the straight-tube LED lamp is simply provided in a globe (bulb) of the incandescent light bulb.

The present invention has been conceived in view of the problem, and it is an object of the present invention to provide a light-emitting device, and a lamp having the multidirectional light distribution property.

Solution to Problem

In order to solve the problem described above, a light-emitting device according to an aspect of the present invention includes a base which is translucent; a semiconductor light-emitting element provided on the base; a sealing member for sealing the semiconductor light-emitting element and including a first wavelength conversion material for converting a wavelength of light emitted by the semiconductor light-emitting element to a predetermined wavelength; and a groove provided on a side of the semiconductor light-emitting element, recessed from a top surface of the base on which the semiconductor light-emitting element is provided or a back surface of the base which is a surface opposite to the top surface, and for holding a second wavelength conversion material for converting the wavelength of the light emitted by the semiconductor light-emitting element to the predetermined wavelength.

With this configuration, the light emitted from the semiconductor light-emitting element is emitted to outside after converting the wavelength of the light to the predetermined wavelength by the first wavelength conversion material included in the sealing member. Furthermore, the light emitted from the semiconductor light-emitting element is emitted to outside after converting the wavelength of the light into the predetermined wavelength by the second wavelength conversion material held in the groove provided in the base at the side of the semiconductor light-emitting element.

Stated differently, if the semiconductor light-emitting element is provided on the upper surface of the base, the light emitted from the semiconductor light-emitting element is emitted as the light having the predetermined wavelength at least upward and laterally from the base.

Furthermore, since the second wavelength conversion material is held by the groove, the problems such as complex manufacturing process and detachment of a material including the second wavelength conversion material from the base, which occurs when the material is applied on side surfaces of the base, for example. In particular, applying the material on the side surfaces of a board having a thickness of approximately 1 mm which is used as the base is not easy, and the material tends to be detached. Accordingly, the configuration of the light-emitting device according to this aspect is effective.

As described above, the light-emitting device according to this aspect has multidirectional light distribution property, and is highly practical.

In the light-emitting device according to an aspect of the present invention, the groove may be provided on both sides of the semiconductor light-emitting element.

With this configuration, when the semiconductor light-emitting element is provided on the top surface of the base, the light having a wavelength converted into the predetermined wavelength may be emitted at least upward and toward both sides of the base.

In the light-emitting device according to an aspect of the present invention, the groove may be provided around the semiconductor light-emitting element.

With this configuration, when the semiconductor light-emitting element is provided on the top surface of the base, the light having a wavelength converted into the predetermined wavelength may be emitted at least upward and toward all of the sides of the base.

In the light-emitting device according to an aspect of the present invention, the first wavelength conversion material and the second wavelength conversion material may be made of a same material, and the sealing member may seal the semiconductor light-emitting element and be filled inside of the groove so that the second wavelength conversion material is held in the groove.

With this configuration, the sealing member covers the semiconductor light-emitting element and is continuously provided to the inside of the groove. More specifically, when manufacturing the light-emitting device according to this aspect, filling the groove with the resin upon applying the resin composing the sealing member on the semiconductor light-emitting element allows forming the sealing member and providing the second wavelength conversion material in the groove. More specifically, the light-emitting device having multidirectional light distribution property can be manufactured by effective processes.

The light-emitting device according to an aspect of the present invention may further include a wavelength conversion part provided on the back surface of the base, and including a third wavelength conversion material for converting the wavelength of the light emitted by the semiconductor light-emitting element to the predetermined wavelength.

With this configuration, when the semiconductor light-emitting element is provided on the top surface of the base, the light having a wavelength converted into the predetermined wavelength may be emitted omnidirectionally from the center of the base.

In the light-emitting device according to an aspect of the present invention, the wavelength conversion part is a sintered material film formed on the back surface, and the sintered material film includes the third wavelength conversion material and a binder for sintering made of an inorganic material.

With this configuration, the resistance to heat and vibration of the wavelength conversion part may be improved.

In the light-emitting device according to an aspect of the present invention, the first wavelength conversion material, the second wavelength conversion material, and the third wavelength conversion material may be phosphor particles which are excited by the light emitted by the semiconductor light-emitting element and emit light.

With this configuration, a common material may be used for the wavelength conversion materials used for different parts of the light-emitting device. With this, the light-emitting device is manufactured more effectively, and the color of the light emitted multidirectionally becomes more uniform.

In the light-emitting device according to an aspect of the present invention, a plurality of the semiconductor light-emitting elements may be provided on the top surface of the base, and at least part of the groove may be extended along a direction in which the plurality of semiconductor light-emitting elements are arranged.

With this configuration, it is possible to implement a light-emitting device having multidirectional light distribution property and a high light intensity.

A lamp according to an aspect of the present invention includes the light-emitting device according to one of the aspects described above.

With this configuration, the lamp having multidirectional light distribution property can be implemented.

Advantageous Effects of Invention

According to the present invention, the light-emitting device and the lamp having multidirectional light distribution property can be implemented.

DESCRIPTION OF EMBODIMENTS

The following shall describe the light-emitting device and the lamp according to the embodiments of the present invention with reference to the drawings. Note that, the figures are schematic diagrams, and illustration is not necessarily strictly accurate.

Furthermore, each of the embodiments illustrates one specific example of a preferable embodiment of the present invention. The numbers, shape, components, arrangements of the components and the connections are merely examples, and there is no intention of limiting the present invention. The present invention is defined by Claims. Accordingly, among the components in the following embodiments, the components not recited in claim 1 are not necessary for solving the problem of the present invention but included as a part of preferable embodiments.

(Embodiment 1)

First, the overall configuration of the light-emitting device according to the embodiment 1 of the present invention shall be described with reference to FIGS. 1 and 2.

Figure 1:
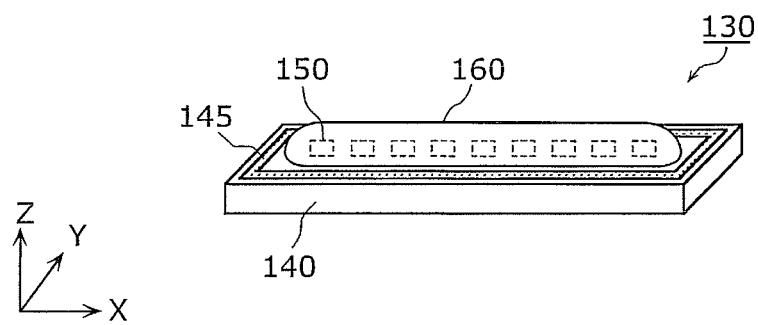
FIG. 1 is an external perspective view of the light-emitting device according to the embodiment 1 of the present invention.

FIG. 1 is an external perspective view of the light-emitting device 130 according to the embodiment 1 of the present invention. FIG. 2 is a top view of the light-emitting device 130 according to the embodiment 1.

Note that, illustration and detailed description of the elements such as wiring and electrodes in the light-emitting device 130 are emitted in order to precisely illustrate and describe the structural features of the light-emitting device 130.

Figure 2:
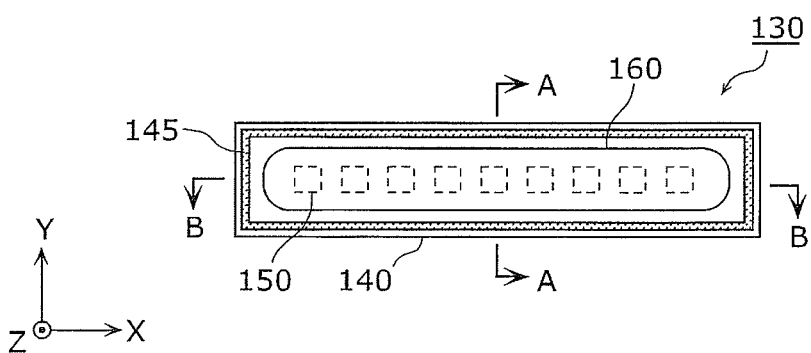
FIG. 2 is top view of the light-emitting device according to the embodiment 1 of the present invention.

As illustrated in FIGS. 1 and 2, the light-emitting device 130 according to the embodiment 1 of the present invention is an LED module which emits predetermined illuminating light. The light-emitting device 130 includes a translucent base 140, LEDs 150 provided on the base 140, a sealing member 160 for sealing the LEDs 150, and a groove 140 provided at the sides of the LEDs 150.

The base 140 is a board of approximately 1 mm thick, for example. As the base 140, a translucent ceramic board made of alumina or aluminum nitride, a transparent glass board, a board made of quartz, a sapphire board, or a board made of resin is used.

The LED 150 is an example of the semiconductor light-emitting element. In the embodiment 1, LEDs 150 are provided in line on the upper surface of the base 140. In addition, the LEDs 150 are connected in series by the wiring which is not illustrated, and emit light by a power supplied from the electrodes provided at the ends of the row of LEDs 150.

The LEDs 150 are directly mounted on the upper surface of the base 140. Each of the LEDs 150 is a bare chip which emits visible light in a single color, and is mounted on the base 140 by die-bonding using a translucent die-attaching (die-bonding) material.

Each of the LEDs 150 is an LED chip which emits light omnidirectionally, that is, upward, laterally, and downward of the LED 150, and is configured to emit 20% of the total amount of light laterally, 60% of the total amount of light upward, and 20% of the total amount of light downward, for example.

A blue LED chip which emits blue light is used for the LED 150. As the blue LED chip, a gallium nitride series semiconductor light-emitting element made of an InGaN series material having the center wavelength from 440 nm to 470 nm is used.

The sealing member 160 collectively seals all of the LEDs 150 on the base 140, and includes a first wavelength conversion material for converting the wavelength of the light emitted by the LEDs 150 into a predetermined wavelength.

In the embodiment 1, the sealing member 160 is a phosphor-containing resin including predetermined phosphor particles as the first wavelength conversion material in a predetermined resin. The sealing member 160 is a translucent material such as a silicone resin in which predetermined phosphor particles are dispersed, for example.

The groove 145 is a groove recessed from the top surface of the base 140 on which the LEDs 150 are provided. A second wavelength conversion material for converting the wavelength of the light emitted by the LEDs 150 into the predetermined wavelength is held in the groove 145.

Furthermore, in the embodiment 1, at least part of the groove 145 extends along the direction in which the LEDs 150 are arranged. More specifically, as illustrated in FIG. 2, the groove 145 is provided around all of the LEDS 150. With respect to one of the LEDs 150, the groove 145 is provided on at least both sides of the LED 150.

Figure 3:
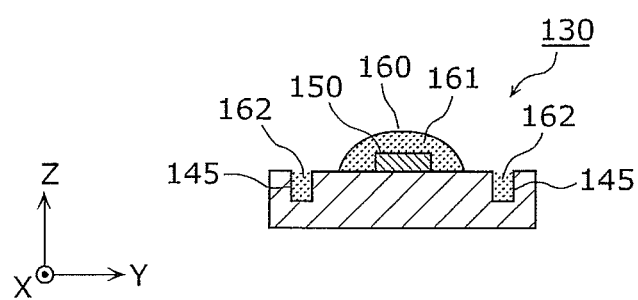
FIG. 3 is a cross-sectional view along A-A cross section in FIG. 2.
Figure 4:
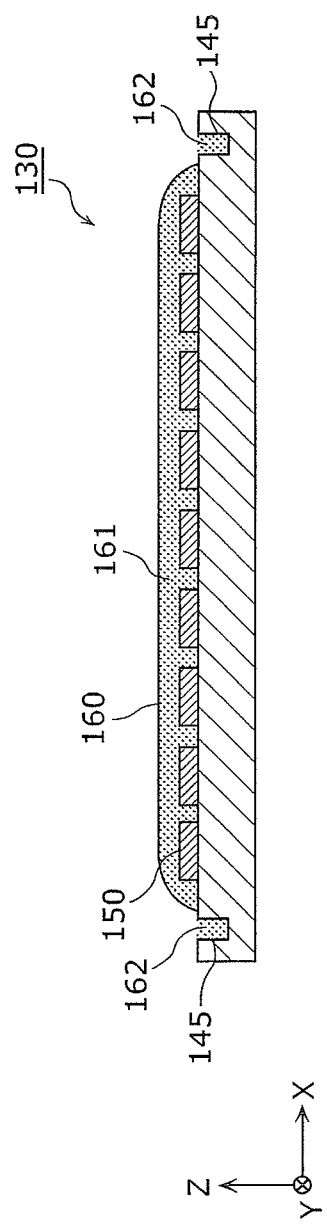
FIG. 4 is a cross-sectional view along B-B cross section in FIG. 2.

FIG. 3 is a cross-sectional view illustrating the A-A cross-section in FIG. 2. FIG. 4 is a cross-sectional view illustrating the B-B cross-section in FIG. 2.

As illustrated in FIGS. 3 and 4, the sealing member 160 includes the first wavelength conversion material 161, and the second wavelength conversion material 162 is held in the groove 145.

More specifically, a phosphor containing resin which is a resin containing the predetermined phosphor particles is held in the groove 145 as the second wavelength conversion material 162.

The light-emitting device 130 according to the embodiment 1 has the multidirectional light distribution property with the configuration.

Figure 5:
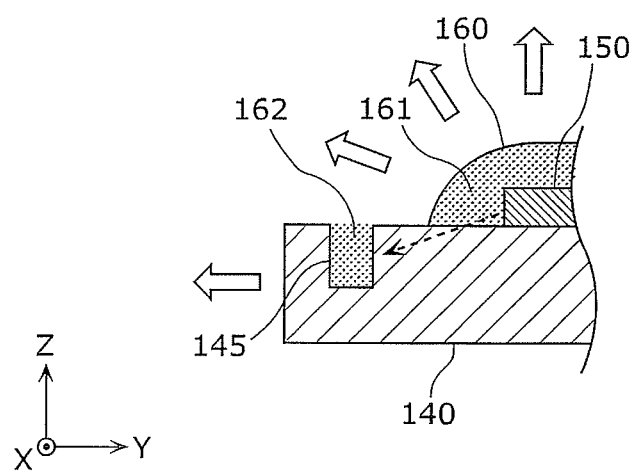
FIG. 5 is a schematic diagram for describing basic light-distribution property of the light-emitting device according to the embodiment 1.

FIG. 5 is a schematic view for describing the basic light distribution property of the light-emitting device 130 according to the embodiment 1.

As illustrated in FIG. 5, the light emitted by the LED 150 passes through the sealing member 160 and is emitted upward, and is emitted laterally across the groove 145.

More specifically, a blue LED is used for the LED 150, and yellow phosphor particles of yttrium, aluminum, and garnet (YAG) series may be used as the first wavelength conversion material 161 and the second wavelength conversion material 162.

The yellow phosphor particles are excited by the blue light from the blue LED chip, thereby emitting yellow light. Accordingly, white light obtained by the yellow light and the blue light from the LED 150 is emitted.

More specifically, the blue light emitted by the LED 150 turns to white light by the wavelength conversion of the first wavelength conversion material 161 when passing through the sealing member 160, and is emitted upward (positive direction of Z axis).

The blue light emitted from the LED 150 passes through the translucent base 140 and the groove 145, turned into white light by the wavelength conversion of the second wavelength conversion material 160 held in the groove 145, and is emitted laterally (toward left in FIG. 5).

Furthermore, in the embodiment 1, the groove is formed around the LEDs 150 as illustrated in FIG. 2. With this, the white light is emitted upward and toward all of the sides of the base 140.

Here, the height of the LED 150 is, for example, approximately 100 µm, and the height of the sealing member 160 is, for example, approximately 0.5 mm. Furthermore, the depth of the groove 145 is, for example, approximately 0.3 mm, and the width of the groove 145 is, for example, approximately 0.5 mm.

Note that, in the embodiment 1, an optical length of light emitted upward by the LED 150 and passing through the sealing member 160 (that is, a distance from the upper surface of the LED 150 to the top of the sealing member 160) is longer than an optical length of light emitted laterally by the LED 150 and passing through the phosphor containing resin, that is, passing through the sealing member 160 and passing across the groove 145 (that is, a value obtained by adding an optical length through the sealing member 160 and an optical length through the phosphor containing resin held in the groove 145).

In this case, the concentration of the phosphor particles (the second wavelength conversion material 162) contained in the phosphor containing resin held in the groove 145 is changed to be thinner than the concentration of the phosphor particles included in the sealing member 160 (the first wavelength conversion material 161). With this, it is possible to suppress the unevenness in the color of the light emitted from the light-emitting device 130 as a whole.

Here, instead of providing the groove 145 holding the phosphor containing resin in the base 140 as in the embodiment 1, the phosphor containing resin may be applied on the side surface of the base 140 such that the white light is emitted to the sides.

However, in this case, in addition to the process for forming the sealing member 160 by applying the phosphor containing resin above the LEDs 150, a process for sequentially applying the phosphor containing resin on the four side surfaces of the base 140 while rotating the base such that one of the four side surfaces faces upward sequentially will be necessary. In other words, there is a problem that the manufacturing process of the light-emitting device 130 becomes more complex.

In addition, when forming the film of the phosphor containing resin on the side surfaces of the base 140, the phosphor containing resin needs to be formed within the width of the side surface in the thickness direction, so as not to increase the thickness of the base 140, for example.

However, as described above, when the board with the thickness of approximately 1 mm is used as the base 140, it is difficult to form the film of phosphor containing resin within the thickness of approximately 1 mm. Furthermore, even if the film of the phosphor containing resin is formed on the side surfaces, there is another problem that the film tends to be detached since the binding area is not sufficient.

In order to address the problem, in the light-emitting device 130 according to the embodiment 1, the groove 145 is provided at the sides of the LEDs 150 on the base 140, and the phosphor containing resin containing the second wavelength conversion material 162 is held in the groove 145 as described above. More specifically, the configuration for wavelength conversion of the light emitted from the base 140 laterally is implemented using an easy and highly practical method.

In particular, when the groove 145 is recessed from the top surface of the base 140 as in the embodiment 1, a process for applying the phosphor containing resin on the LEDs 150 for forming the sealing member 160 and the process for filling the groove 145 with the phosphor containing resin can be performed continuously.

As described above, the light-emitting device 130 according to the embodiment 1 has multidirectional light distribution property, and is highly practical. Furthermore, the multidirectional light distribution property of the light-emitting device 130 increases the luminous flux.

Furthermore, in the light-emitting device 130 with the configuration described above, providing the wavelength conversion part on the back surface allows emitting white light downward further.

Figure 6:
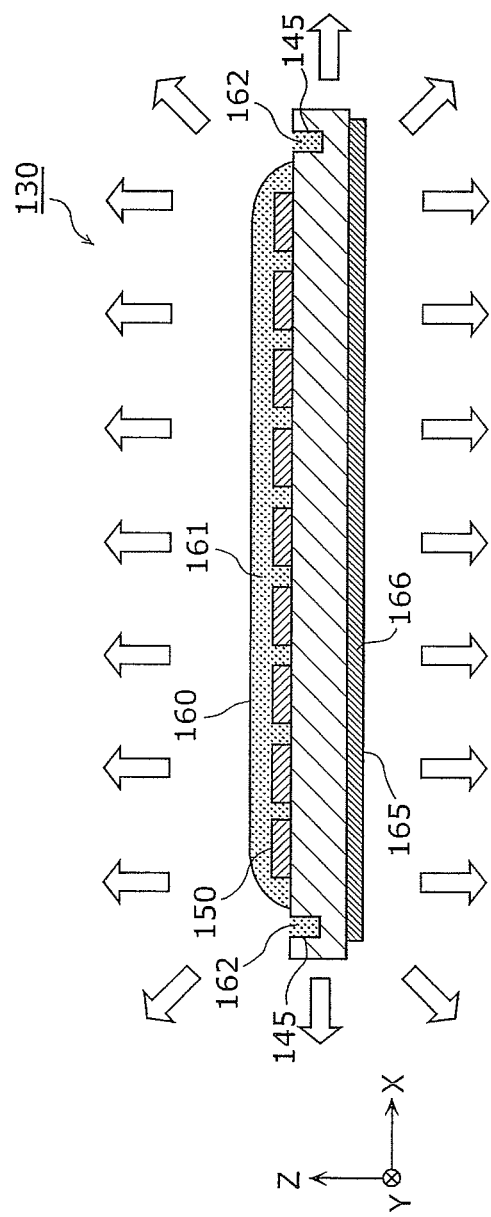
FIG. 6 is a cross-sectional view schematically illustrating the light-emitting device according to the embodiment 1 provided with a wavelength conversion part on the back surface.

FIG. 6 is a cross-sectional view illustrating the overall configuration of the light-emitting device 130 according to the embodiment 1 which includes the wavelength conversion part on the back surface. Note that the cross section corresponds to the B-B cross section in FIG. 2.

In the light-emitting device 130 according to FIG. 6, the wavelength conversion part 165 is provided on the back surface which is a surface opposite to the top surface on which the LEDs 150 are provided.

The wavelength conversion part 165 includes the third wavelength conversion material 166 for converting the light emitted by the LED 150 into the predetermined wavelength.

More specifically, the wavelength conversion part 165 converts the wavelength of the light transmitted the base 140 and travels toward the back surface by the wavelength conversion material 166, among the light emitted by the LED 150, and emits the light after the wavelength conversion.

In the embodiment 1, the third wavelength conversion material 166 is also phosphor particles, as the first wavelength conversion material 161 and the second wavelength conversion material 162.

More specifically, the third wavelength conversion material 166 is YAG series yellow phosphor particles, and emits yellow light when excited by the blue light emitted from the LED 150. Accordingly, white light is emitted from the wavelength conversion part 165.

Furthermore, the wavelength conversion part 165 is coated on the back surface of the base 140 as the sintered material film including the third wavelength conversion material 166 for converting the wavelength of light as described above, and a binder for sintering made of an inorganic material.

The binder for sintering included in the wavelength conversion part 165 is composed of an inorganic material and transmits the light emitted by the LED 150 and the light emitted by the third wavelength conversion material 166 after wavelength conversion.

In the embodiment 1, as the binder for sintering, glass frit (glass powder) made of silicon oxide ($SiO_2$) as the major component may be used. The glass frit is a binder (bonding material) for binding the phosphor particles which are the third wavelength conversion material and the base 140, and is made of material having a high transmittance to visible light.

The glass frit functions as the binder (bonding material) by heating in order to fuse the glass powder. As the glass frit, $SiO_2$-$B_2O_3$-$R_2O$ series, $B_2O_3$-$R_2O$ series or $P_2O_5$-$R_2O$ series (Note that, all of the $R_2O$ is $Li_2O$, $Na_2O$, or $K_2O$) may be used. Alternatively, as the material for the binder for sintering, $SnO_2$-$B_2O_3$ made of low-melting point crystals may also be used other than the glass frit.

The wavelength conversion part 165 with the configuration described above may be formed using a paste of the third wavelength conversion material 166, the binder for sintering, solvent, and others obtained by mixing and kneading. The paste is printed or applied on the back surface of the base 140, and sintered so as to form the wavelength conversion part 165.

Note that, when the sintered material film is formed on the base 140 as described above, highly heat resistant ceramic board or others are used as the base 140.

Alternatively, the wavelength conversion part 165 may not be provided in the light-emitting device 130 as the sintered material film. The wavelength conversion part 165 may be formed with the resin containing the yellow phosphor particles applied to the base 140, for example.

More specifically, the wavelength conversion part 165 is not limited to a particular material, shape, and arrangement as long as the wavelength of the light transmitted the base 140 and emitted toward outside from the back surface is converted into the predetermined wavelength.

As described above, the light-emitting device 130 can include the wavelength conversion part 165 on the back surface of the base 140. By having the wavelength conversion part 165, the light-emitting device 130 can emit the light converted into the predetermined wavelength omnidirectionally as illustrated in FIG. 6 by including the wavelength conversion part 165. Consequently, the luminous flux obtained by the light-emitting device 130 is improved further.

Note that, the omnidirectional light distribution property can be achieved not only by including the wavelength conversion part 165 on the back surface of the base 140, but also by binding the back surfaces of two light-emitting devices 130.

Alternatively, a reflective film reflecting light may be provided on the back surface of the base 140.

Figure 7:
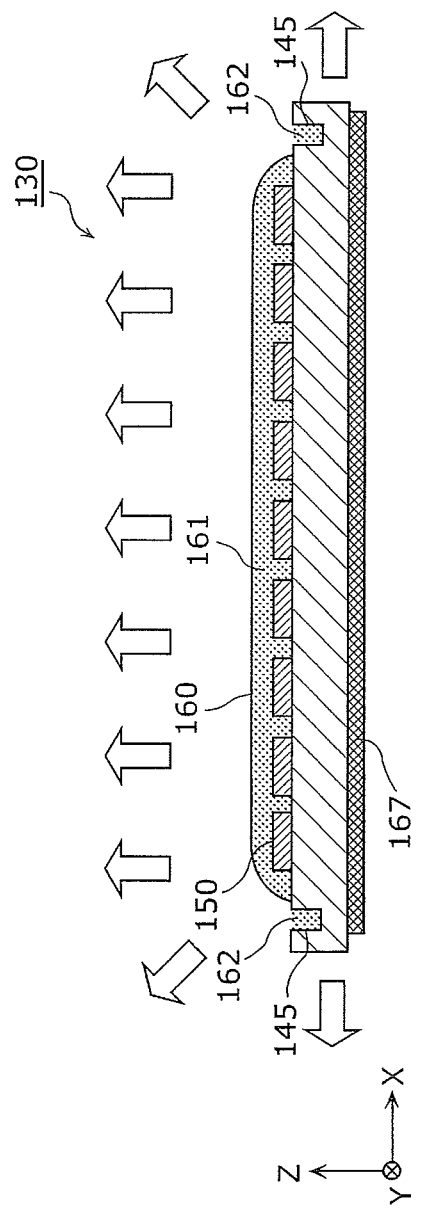
FIG. 7 is a cross-sectional view schematically illustrating the light-emitting device according to the embodiment 1 provided with a reflective film on the back surface.

FIG. 7 is a cross-sectional view illustrating the overall configuration of the light-emitting device 130 according to the embodiment 1 which includes the reflective film on the back surface. Note that the cross section corresponds to the B-B cross section in FIG. 2.

The light-emitting device 130 illustrated in FIG. 7 includes a reflective film 167 which reflects the light which is transmitted the base 140 toward the surface of the base 140 (that is, the top surface) on the back surface of the base 140.

A film including fine particles of metal oxide and the glass frit is used as the reflective film 167, for example. The glass frit serves as the binder (bonding material) for binding the fine particles of metal oxide and the base 140 when melted by heat.

The fine particles of metal oxide include fine particles composed of titanium oxide such as rutile and anatase, zirconium oxide, aluminum oxide, zinc oxide, and others. Note that, the fine particles refer to particles having a grain size of a few μm or smaller. Since the glass frit has a high transmittance to visible light and the fine particles of metal oxide have a high reflectance of visible light, the reflective film 167 can effectively reflect the light from the LED 150.

As described above, the light-emitting device 130 can include the reflective film 167 on the back surface of the base 140. In the light-emitting device 130, white light can be emitted toward the sides of the base board 140 by the second wavelength conversion material 162 held in the groove 145, and by including the reflective film 167, the luminous flux of the light at least emitted from the side of the base board 140 on which the LED 150 is provided improves further.

Furthermore, as in the embodiment 1, if the first wavelength conversion material 161 included in the sealing member 160 and the second wavelength conversion material 162 held in the groove 145 is the same, the sealing member 160 may be formed to cover the LEDs 150 and continuously to the inside of the groove 145.

More specifically, the sealing member 160 and the material for wavelength conversion held in the groove 145 may be provided as one component in the light-emitting device 130.

Figure 8:
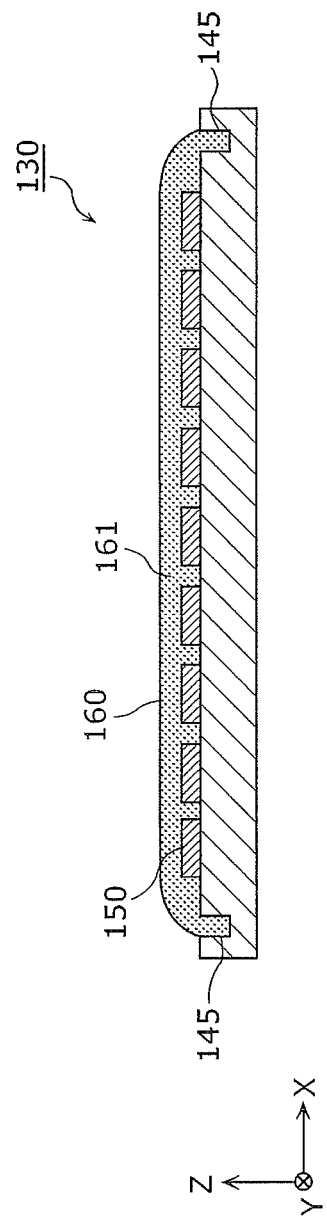
FIG. 8 is a cross-sectional view illustrating the overall configuration of the light-emitting device according to the embodiment 1 in which the same material is used for the sealing member and a material filled inside the groove.

FIG. 8 is a cross-sectional view illustrating the overall configuration of the light-emitting device 130 according to the embodiment 1 in which the sealing member 160 and the material inside the groove 145 are as one component provided.

As described above, forming the sealing member 160 to cover the LEDs 150 and continuously toward the inside of the groove 145 makes the manufacturing process of the light-emitting device 130 more efficient, for example.

More specifically, when manufacturing the light-emitting device 130 illustrated in FIG. 8, when applying the phosphor containing resin as the sealing member 160, the phosphor containing resin may be applied on the base 140 such that the phosphor containing resin flows into the groove 145.

This allows fabrication of the light-emitting device 130 with multidirectional light distribution property through an effective process.

Furthermore, in the embodiment 1, the groove 145 is formed in the base 140 around the LEDs 150, as illustrated in FIG. 2. However, the groove 145 may be provided at a position on the sides of the LEDs 150 in the base 140. The following shall describe aspects of the groove 145 using several examples.

Figure 9:
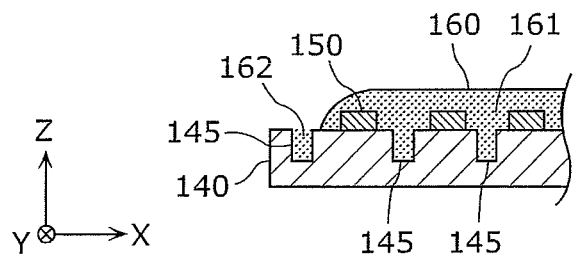
FIG. 9 is a first diagram illustrating another example of the grooves according to the embodiment 1 formed in different positions.

FIG. 9 is a first diagram illustrating another example of the grooves 145 according to the embodiment 1 provided in different positions.

As illustrated in FIG. 9, the groove 145 may be formed between adjacent LEDs 150 in the light-emitting device 130. In this case, the phosphor containing resin included in the sealing member 160 is provided in the groove 145 between the two LEDs 150. Accordingly, the groove 145 serves as a component for converting the wavelength of at least part of the light traveling from the LEDS 150 on the base 140 toward the back surface, for example.

Figure 10:
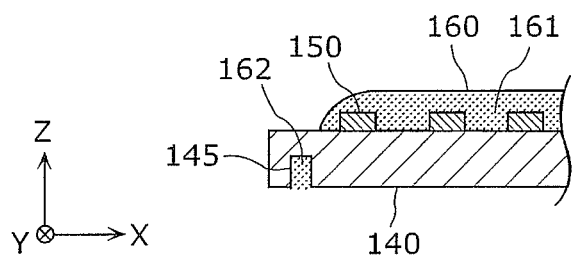
FIG. 10 is a second diagram illustrating another example of the groove according to the embodiment 1 formed in a different position.

FIG. 10 is a second diagram illustrating another example of the groove 145 according to the embodiment 1 provided in a different position.

As illustrated in FIG. 10, the groove 145 may be provided on the side of the LED 150 and in the back surface of the base 140. Even when the groove 145 is recessed from the back surface, the light passing through the groove 145 from a direction of the LED 150 is converted into the predetermined wavelength by the second wavelength conversion material 162 held in the groove 145. Stated differently, white light can be emitted from the surface on the left of the base 140 in FIG. 10.

Alternatively, the groove 145 may be provided on the top surface and the back surface of the base 140.

Figure 11:
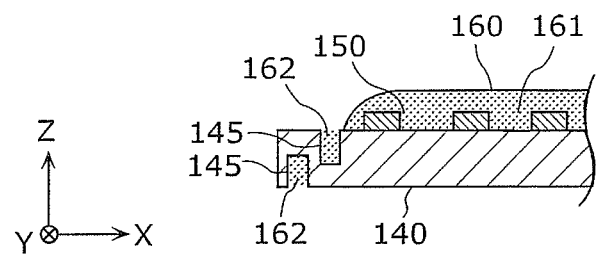
FIG. 11 is a third diagram illustrating another example of the grooves according to the embodiment 1 formed in different positions.

FIG. 11 is a third diagram illustrating another example of the grooves 145 according to the embodiment 1 provided in a different position.

As illustrated in FIG. 11, when the grooves 145 are recessed from both the top surface and the back surface of the base 140, white light can be emitted from the entire surface on the left side of the base 140 in FIG. 10, for example.

Figure 12:
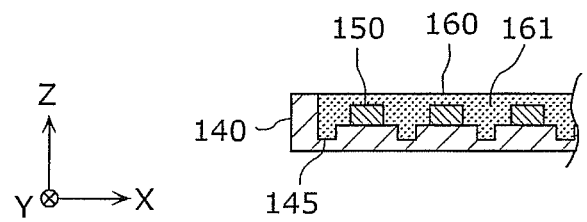
FIG. 12 is a fourth diagram illustrating another example of the grooves according to the embodiment 1 formed in different positions.

FIG. 12 is a fourth diagram illustrating another example of the grooves 145 according to the embodiment 1 provided in different positions.

As illustrated in FIG. 12, the groove 145 may be entirely provided inside of the base 140 having recesses.

More specifically, the base 140 illustrated in FIG. 12 has a structure of a package in which the phosphor containing resin composing the sealing member 160, and LEDs 150 are provided on the surface corresponding to the bottom surface of the package. In addition, the bottom surface is the top surface on which the LEDs 150 are provided. Stated differently, even when the base 140 has the structure illustrated in FIG. 12, the groove 145 may be provided on the sides of the LEDs 150, and recessed from the top surface.

Figure 13:
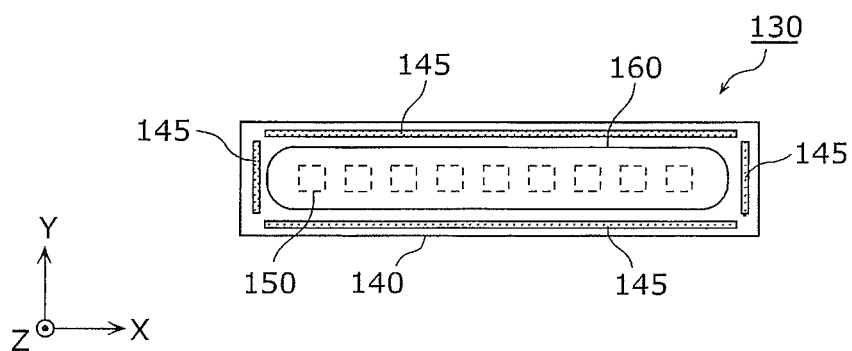
FIG. 13 is a first diagram illustrating another example the whole shape of the grooves according to the embodiment 1.

FIG. 13 is the first diagram illustrating another example of the entire shape of the groove 145 according to the embodiment 1.

As illustrated in FIG. 13, the groove 145 may be provided separately along each of the four sides on the top surface of the base 140. Stated differently, the groove 145 may be composed of separate parts.

More specifically, when providing the groove 145 around the LEDs 150 in the base 140, it is not necessary to form the groove 145 continuously as illustrated in FIG. 2, and the grooves 145 independent of each other may be provided around the LEDs 150, as illustrated in FIG. 13.

For example, if the unevenness in color of light emitted from the light-emitting device 130 toward the sides does not cause any substantial problem, the grooves 145 which are not connected and separate from one another may be provided around the LEDs 150. With this, the total amount of the phosphor containing resin held in the groove 145 may be reduced, for example.

Figure 14:
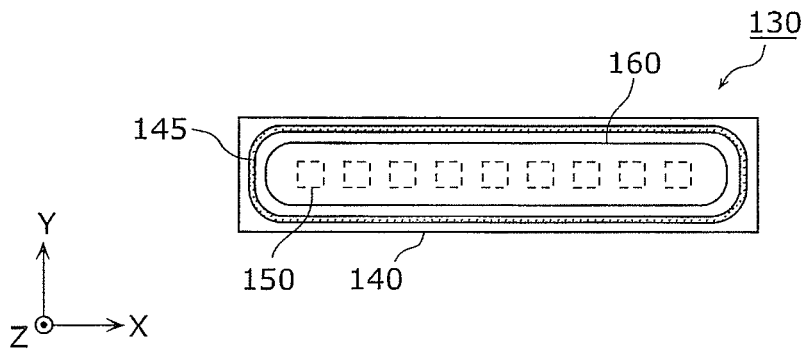
FIG. 14 is a second diagram illustrating another example the whole shape of the groove according to the embodiment 1.

FIG. 14 is the second diagram illustrating another example of the entire shape of the groove 145 according to the embodiment 1.

As illustrated in FIG. 14, the path of the groove 145 does not have to be a rectangle in top view, and may be oval with rounded corners, for example.

In this case, the variations in distance from the LED 150 at the left end of the LEDs 150 to the curved part of the groove 145 at the left end can be reduced, for example. In the same manner, the variations in the distances from the LED 150 at the right end to the curved part of the groove 145 at the right end can be reduced. With this, for example, the unevenness in color or luminance in the light emitted outward through the curved part.

Furthermore, in the embodiment 1, the light-emitting device 130 includes LEDs 150. However, the light-emitting device 130 may include at least one LED 150.

Figure 15:
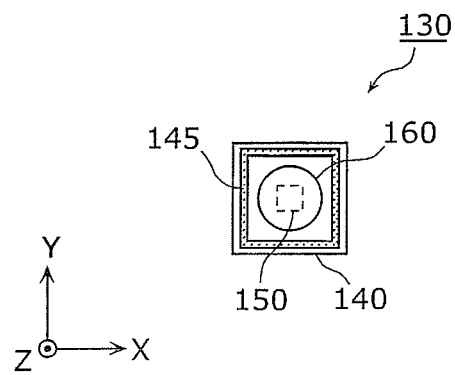
FIG. 15 is a diagram illustrating an overall configuration the light-emitting device according to the embodiment 1 including only one LED.

FIG. 15 illustrates the overall configuration of the light-emitting device 130 according to the embodiment 1 including only one LED 150.

As shown in FIG. 15, when the light-emitting device 130 includes only one LED 150, the light-emitting device 130 can be used as the light-source for the lamp of different types requiring different number of the LEDs 150, for example. More specifically, each of the lamps of different types can have multidirectional light distribution property.

In the embodiment 1, the light-emitting device 130 includes a row of LEDs 150 group, as illustrated in FIG. 2 and others. However, the light-emitting device 130 may includes a group of LEDs 150 in multiple rows.

Figure 16:
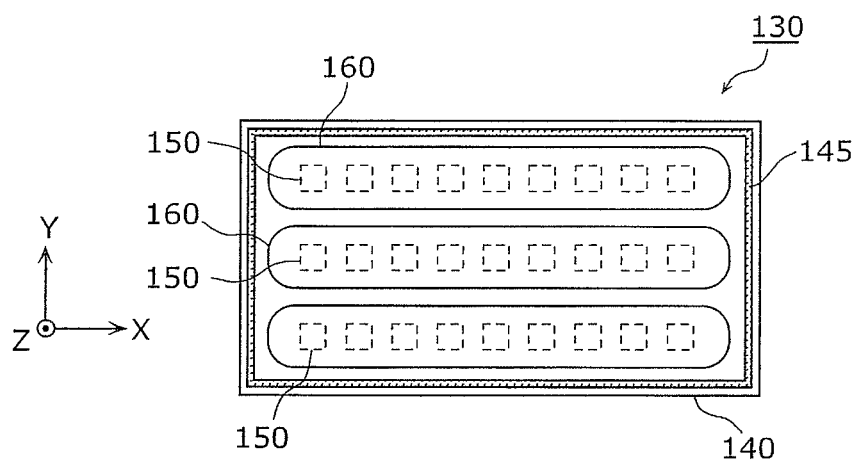
FIG. 16 is a diagram illustrating an overall configuration the light-emitting device according to the embodiment 1 including a group of LEDs consisting of multiple rows.

FIG. 16 illustrates the overall configuration of the light-emitting device 130 according to the embodiment 1 including a group of LEDs 150 in multiple rows.

More specifically, the light-emitting device 130 in FIG. 16 includes the group of LEDs 150 arranged in three rows.

As described above, even when the light-emitting device 130 includes the group of LEDs 150 in multiple rows, by providing the groove 145 in which the second wavelength conversion material 162 is held on the sides and the outside of at least one LED 150 at the outermost part, white light obtained by the wavelength conversion may be emitted from the side surfaces corresponding to the sides.

Furthermore, as illustrated in FIGS. 2 and 15, when multiple LEDs 150 are provided on the base 140, it is not necessary to form the sealing member 160 for each row, and the sealing member 160 may be formed separately for each LED 150.

In the embodiment 1, the groove 145 is recessed from the base 140 parallel to the thickness direction (Z axis direction) of the tabular base 140, as illustrated in FIG. 3 and others.

However, the groove 145 may be recessed from the base 140 oblique to the thickness direction of the base 140.

For example, the groove 145 which is recessed oblique to the thickness direction of the base board 140 may be formed by obliquely irradiating, with a laser beam, the base board 140 without the groove 145 obliquely.

For example, in a case in which the groove 145 is tilted such that the bottom surface of the groove 145 is closer to the left side surface of the base 140, the optical path length of the light traveling from the LED 150 toward the groove 145 (for example, the dotted arrow in FIG. 5) and passing through the second wavelength conversion material 162 held in the groove 145 is longer than the optical path length in a case in which the depth direction of the groove 145 is parallel to Z axis direction, as illustrated in FIG. 5.

In other words, when the groove 145 is recessed obliquely from the thickness direction of the base 140, it is possible to reduce the width of the groove 145 while maintaining the optical path length necessary for the wavelength conversion into the predetermined wavelength by the second wavelength conversion material 162, for example. Consequently, it is possible to reduce the total amount of the phosphor containing resin including the second wavelength conversion material 162 held in the groove 145.

The groove 145 according to the embodiment 1 has a rectangle cross section vertical to the longer direction (X axis direction in FIG. 3), as illustrated in FIG. 3 and others. However, the cross-sectional shape of the groove 145 may not have to be rectangle, and may be composed of a curve entirely or partially. Alternatively, the cross-sectional shape of the groove 145 may be a polygon other than a rectangle such as a triangle.

More specifically, the cross-sectional shape of the groove 145 is not limited as long as the phosphor containing resin including the second wavelength conversion material 162 is held, and it is not necessary for the groove 145 to have the same cross-sectional shape along the length of the groove 145.

In addition, the groove 145 does not have to be provided at the both sides of the LEDs 150 in the base 140.

For example, among all of the sides of the base 140, the groove 145 may be provided only on the front side when it is necessary to emit white light only from the front direction (negative direction of Y axis) in FIG. 1.

(Embodiment 2)

The following shall describe an example of an application of the light-emitting device 130 according to the embodiment 1 to a lamp, based on the embodiment 2.

More specifically, an example in which the light-emitting device 130 according to the embodiment 1 is applied to a light bulb shaped lamp shall be described with reference to FIGS. 17 to 19.

Figure 17:
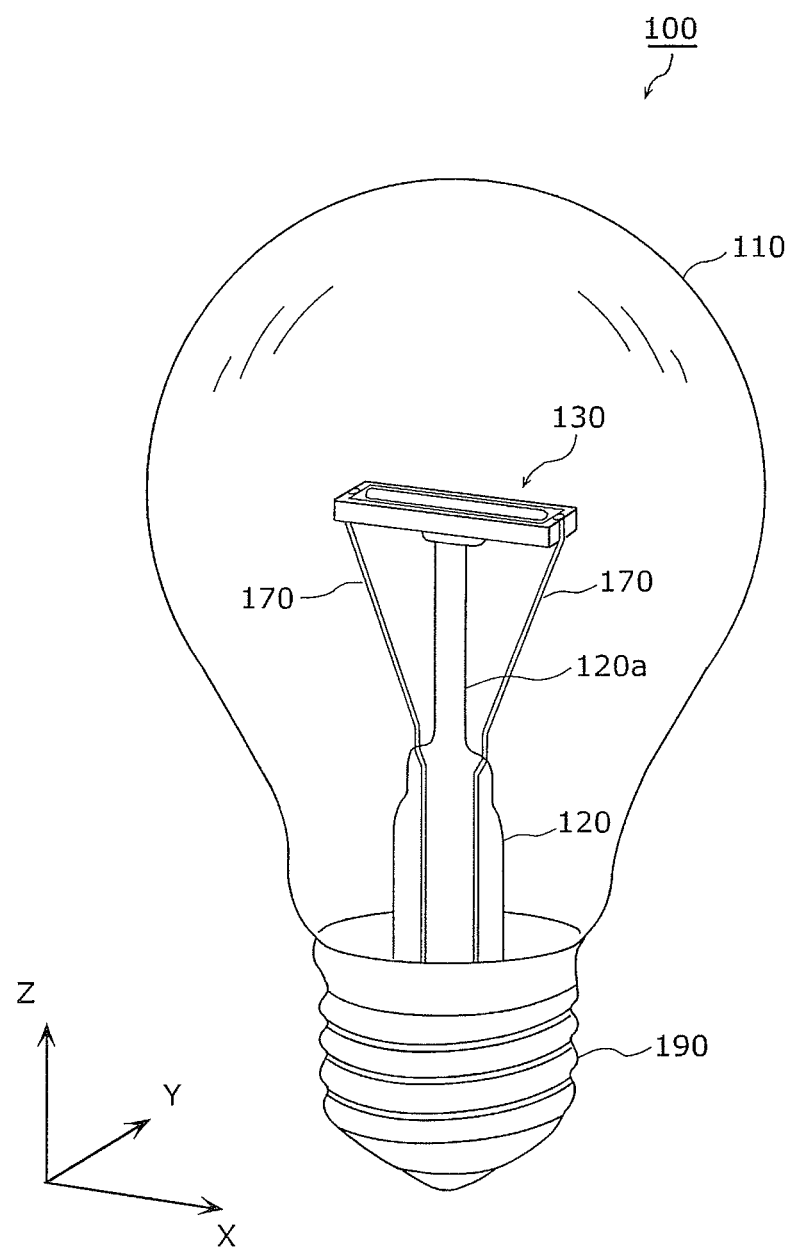
FIG. 17 is a perspective view of the light bulb shaped lamp according to the embodiment 2 of the present invention.

FIG. 17 is a perspective view of the light bulb shaped lamp 100 according to the embodiment 2 of the present invention. FIG. 18 is an exploded perspective view of the light bulb shaped lamp 100 according to the embodiment 2 of the present invention. FIG. 19 is a front view of the light bulb shaped lamp 100 according to the embodiment 2 of the present invention.

Figure 19:
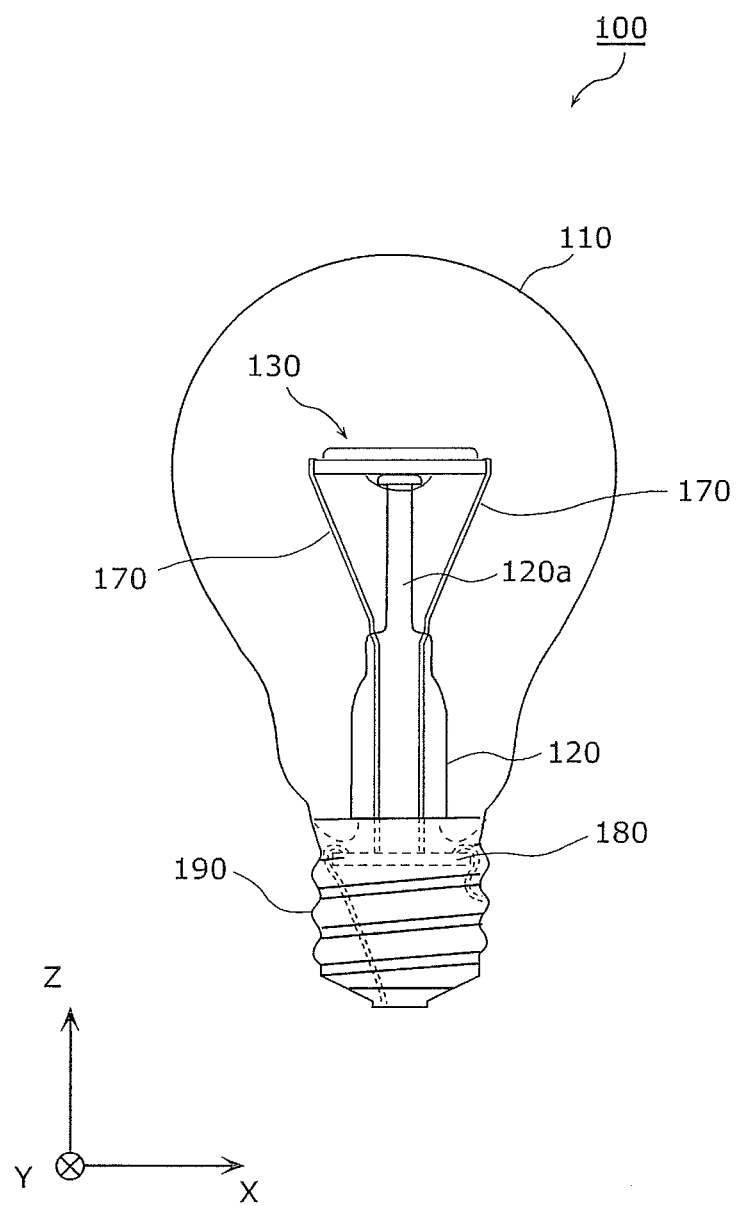
FIG. 19 is a front view of the light bulb shaped lamp according to the embodiment 2 of the present invention.

Note that, in FIG. 19, parts of a lighting circuit 180 and lead wires 170 for holding, located inside a base 190 are shown in dotted lines.

The light bulb shaped lamp 100 is a light bulb including a translucent globe 110 attached to a base 190. The light-emitting device 130 which is an LED module on which the LEDs are mounted is held in the globe 110. The light-emitting device 130 is fixed to the stem 120 extending from an opening 111 of the globe 110 toward the inside of the globe 110.

Figure 18:
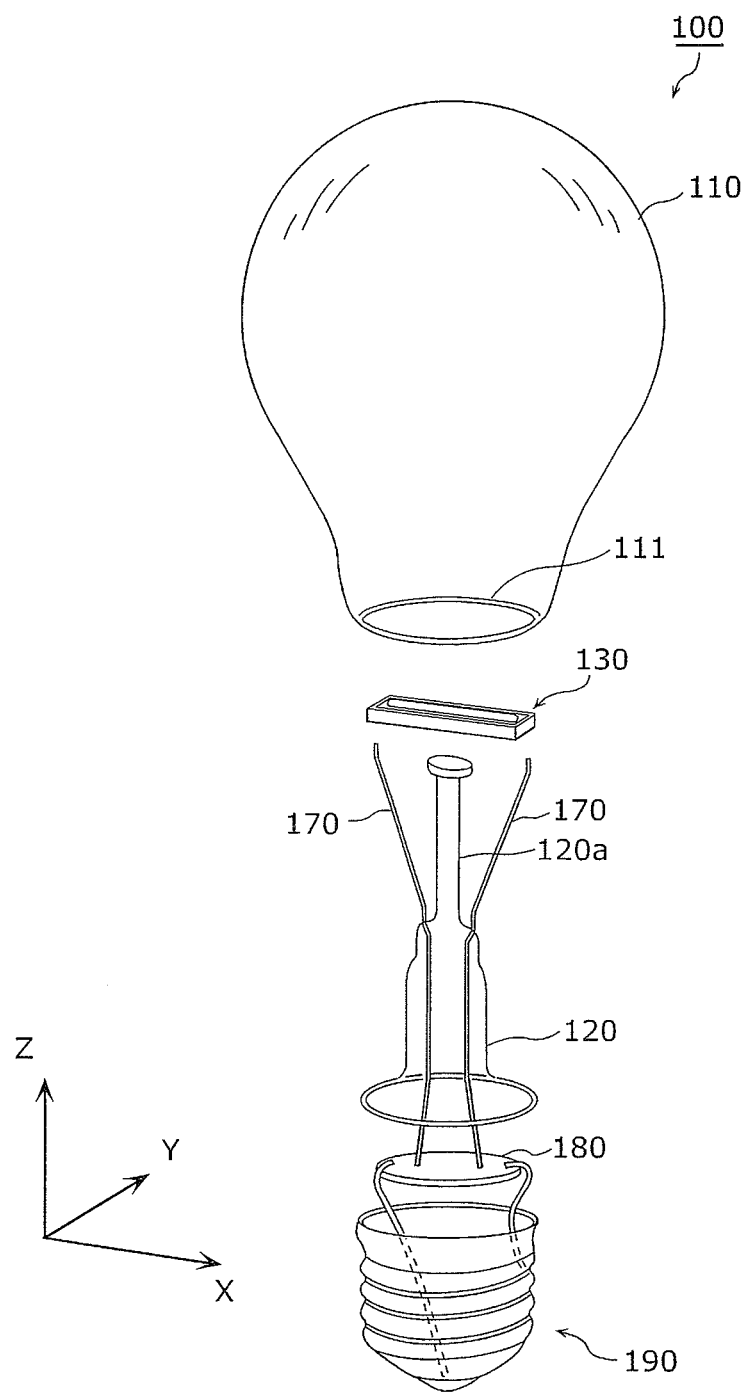
FIG. 18 is an exploded perspective view of the light bulb shaped lamp according to the embodiment 2 of the present invention.

More specifically, as illustrated in FIGS. 17 to 19, the light bulb shaped lamp 100 includes the globe 110, the stem 120, the light-emitting device 130, two lead wires 170, the lighting circuit 180, and the base 190.

The following shall describe the basic components of the light bulb shaped lamp 100.

The globe 110 is a hollow component made of silica glass transparent to visible light. Accordingly, the user can see the LED module 130 housed in the globe 110 from outside of the globe 110. The light bulb shaped lamp 100 can suppress loss of light from the LEDs 150 by the globe 110. Furthermore, the light bulb shaped lamp 100 is highly resistant to heat.

The globe 110 has a shape with one end closed in a spherical shape, and the other end has an opening 111. In other words, the shape of the globe 110 is that a part of hollow sphere is narrowed down while extending away from the center of the sphere, and the opening 111 is formed at a position away from the center of the sphere. In the embodiment 2, the shape of the globe 110 is Type A (JIS C7710) which is the same as a common incandescent light bulb.

Note that, the shape of the globe 110 does not have to be Type A. For example, the shape of the globe 110 may be Type G, Type E, or others. The globe 110 does not have to be made of silica glass. For example, the globe 110 may be a member made of resin such as acrylic.

The stem 120 is provided extending from the opening 111 of the globe 110 toward the inside of the globe 110. More specifically, a rod-shaped extending portion 120a extending to the vicinity of the LED device 130 in the Z axis direction is provided on one end of the stem 120. In other words, the stem 120 according to the embodiment 2 is a member that would be obtained by extending the stem used for a common incandescent light bulb extending toward the inside of the globe 110.

The light-emitting device 130 is fixed to the tip of the extended portion 120a.

The other end of the stem 120 is formed in a flared shape coinciding with the shape of the opening 111. The other end of the stem 120 formed in the flared shape is joined with the opening 111 of the globe 110 so as to close the opening of the globe 110.

In addition, parts of two lead wires 170 are sealed in the stem 120. Accordingly, it is possible to supply power to the light-emitting device 130 in the globe 110 from outside of the globe 110 while keeping the globe 110 airtight. Accordingly, the light bulb shaped lamp 100 can prevent water or water vapor from entering the globe 110 for a long period of time, and it is possible to suppress the degradation of the LED device 130 and a part connecting the LED device 130 and the lead wire 170 due to moisture.

The stem 120 is made of soft glass transparent to visible light. With this, the light bulb shaped lamp 100 can suppress the loss of light generated at the LED 150, by the stem 120. In addition, the light bulb shaped lamp 100 can prevent the shadow formed by the stem 120. Furthermore, white light generated by the LED 150 lights up the stem 120. Thus, the light bulb shaped lamp 100 can achieve visually superior appearance.

Note that, it is not necessary for the stem 120 to be transparent to the visible light, or made of soft glass. For example, the stem 120 may be a member made of a highly heat conductive resin. As the highly heat conductive resin, a silicone resin containing metal particles such as alumina or zinc oxide may be used. In this case, the light bulb shaped lamp 100 can actively transfer the heat generated at the light-emitting device 130 to the globe 110 or the base 190 through the stem 120. Accordingly, the light bulb shaped lamp 100 can suppress the reduction in the light-emitting efficiency and the lifetime of the LED 150 due to the increase in temperature.

Note that, the stem 120 does not have to necessarily close the opening at the globe 110, and may be attached to a part of the opening 111.

The two lead wires 170 are connected to the light-emitting device 130, and the power supplied from the base 190 is supplied to the LEDs 150 through the two lead wires 170.

Here, it is preferable that the lead wires 170 are metal wires including copper having high thermal conductivity. With this, the heat generated at the light-emitting device 130 can be actively transferred to the base 190 through the lead wires 170.

In addition, two lead wires 170 do not have to be provided. For example, when the light bulb shaped lamp 100 includes a plurality of the light-emitting devices 130 in the globe 110, two lead wires 170 may be provided for each of the light-emitting devices 130.

The lead wires 170 are preferably attached to the base 140 pressing the base 140 toward the stem 120. With this, the base 140 can be fixed and held to the stem 120 more firmly.

The lighting circuit 180 is a circuit for causing the LED 150 to emit light, and is housed in the base 190. More specifically, the lighting circuit 180 includes a plurality of circuit elements, and a circuit board on which each of the circuit elements is mounted. In this embodiment, the lighting circuit 180 converts the AC power received from the base 190 to the DC power, and supplies the DC power to the LED chips 150 through the two lead wires 170.

The light-emitting device 130 is the light-emitting device 130 according to the embodiment 1 of the present invention. For example, the light-emitting device 130 illustrated in FIGS. 1 to 5 is used as the light source of the light bulb shaped lamp 100.

When the light bulb shaped lamp 100 is suspended from the ceiling facing downward, white light is emitted to a wide range including an area below the light-emitting device 130 and all of the sides of the light-emitting device 130.

When the light-emitting device 130 including the wavelength conversion part 165 on the back surface is used as the light source of the light bulb shaped lamp 100, the omnidirectional light distribution property equivalent to that of the incandescent lamp using a filament as the light source can be achieved.

Alternatively, each of the light-emitting devices 130 illustrated in FIGS. 7 to 16 may be used as the light source of the light bulb shaped lamp 100.

Note that, in the embodiment 2, the light-emitting device 130 is supported by the stem 120, as illustrated in FIG. 17. However, the light-emitting device 130 may not have to be supported by the stem 120. For example, the light-emitting device 130 may be supported only by the two lead wires 170.

The light bulb shaped lamp 100 having the light-emitting device 130 is described in the embodiment 1. The light-emitting device 130 may also be used as the light source for a lamp of another type.

For example, the light-emitting device 130 may be used as the light source of the straight-tube lamp. For example, when the light-emitting device 130 including the wavelength conversion part 165 on the back surface is used as the light source of the straight tube lamp, omnidirectional light distribution property equivalent to that of conventional straight-tube fluorescent light can be achieved.

Furthermore, the light-emitting device 130 may be used as the light source of a ring-shaped lamp. In this case, forming the entire shape of the light-emitting device 130 illustrated in FIG. 1 along the ring shape of the ring-shaped lamp allows setting the light-emitting device 130 in the ring-shaped lamp easily.

For example, when the light-emitting device 130 including the wavelength conversion part 165 on the back surface is used as the light source of the ring-shaped lamp, omnidirectional light distribution property equivalent to that of conventional ring-shaped fluorescent light can be achieved.

As described above, the light-emitting device 130 can be used as the light source of lamps of various types, not only for the lamp of a specific type.

Although only embodiments 1 and 2 of the light-emitting device and the lamp according to the present invention have been described in detail above, those skilled in the art will readily appreciate that many modifications are possible in the embodiments 1 and 2 without materially departing from the novel teachings and advantages of the present invention. Accordingly, all such modifications are intended to be included within the scope of the present invention.

For example, in the light-emitting device 130, a blue LED chip is used as the LED 150, and yellow phosphor particles are used as the wavelength conversion material from the blue light to the white light. However, the combination of the LED 150 and the phosphor particles are not limited to this combination.

For example, the light-emitting device 130 may emit the white light generated by using a combination of the blue LED chip which emits blue light, green phosphor particles which is excited by the blue light and emits green light, and the red phosphor particles which is excited by the blue light and emits red light.

Alternatively, the light-emitting device 130 may emit the white light may be emitted using a combination of an ultraviolet LED chip which emits ultraviolet light having a wavelength shorter than the wavelength of the light from the blue LED chip, blue phosphor particles, green phosphor particles, and red phosphor particles which are excited mainly by the ultraviolet light and emit blue light, red light, and green light, for example.

In the embodiment 1, when arranging multiple LEDs 150, the LEDs 150 are arranged in a straight line as illustrated in FIGS. 1, 16, and others. However, the arrangement of the LEDs 150 is not limited to this example, and the LEDs 150 may be arranged in a ring-shaped or zigzag.

In the embodiment 1, the wavelength conversion part 165 which is the sintered material film is formed on the back surface of the base 140, as illustrated in FIG. 6. However, the wavelength conversion part 165 may not be provided on the back surface.

For example, the wavelength conversion part 165 may be provided on the top surface of the base 140 on which the LED 150 is provided. In this case, the LED 150 is mounted on the wavelength conversion part 165.

In the embodiment 1, the LED 150 is provided only on one of the two main surfaces perpendicular to the thickness direction of the tabular base 140 (the top surface in the embodiment 1). However, the LEDs 150 may be provided both on the top surface and the back surface.

The light-emitting device 130 including the wavelength conversion part 165 or the reflective film 167 is provided on the back surface of the base is described with reference to FIGS. 6 and 7. However, a component other than these elements may be provided on the back surface of the base 140. For example, a heat sink for dissipating heat may be provided on the back surface of the base 140.

Wit this, the reduction in the light-emitting efficiency of the LEDs 150 due to the increase in temperature can be suppressed.

Note that, even if the heat sink is provided on the back surface of the base 140 as described above, white light can be emitted to the sides of the base 140 by the second wavelength conversion material 162 held in the groove 145, in the same manner as the case in which the reflective film 167 is provided on the back surface of the base 140.

Furthermore, the light-emitting device 130 including the heat sink may be used as the light source for the light bulb shaped lamp 100, the straight-tube lamp, and the ring-shaped lamp described in the embodiment 2.

In the embodiments 1 and 2, the base 140 is a board made of a material such as glass. However, the base 140 does not have to be tabular, and may be a rod-shaped member or curved member, for example.

Furthermore, an LED is used as an example of the semiconductor light-emitting element included in the light-emitting device 130 according to the embodiments 1 and 2. However, the semiconductor light-emitting element included in the light-emitting device 130 may be a semiconductor laser or an organic electro luminescent (EL) light-emitting device.

INDUSTRIAL APPLICABILITY

The present invention is widely applicable as a light-emitting device including a semiconductor light-emitting element, a lamp including the light-emitting device, and others.

REFERENCE SIGNS LIST

100 Light bulb shaped lamp
110 Globe
111 Opening
120 Stem
120a Extended part
130 Light-emitting device
140 Base
145 Groove
150 LED
160 Sealing member
161 First wavelength conversion material
162 Second wavelength conversion material
165 Wavelength conversion part
166 Third wavelength conversion material
167 Reflective film
170 Lead wire
180 Lighting circuit

The invention claimed is:
1. A light-emitting device comprising:
a base which is translucent;
a semiconductor light-emitting element provided on said base;
a sealing member for sealing said semiconductor light-emitting element and including a first wavelength conversion material for converting a wavelength of light emitted by said semiconductor light-emitting element to a predetermined wavelength; and a groove provided on a side of said semiconductor light-emitting element, recessed from a top surface of said base on which said semiconductor light-emitting element is provided or a back surface of said base which is a surface opposite to the top surface, and for holding a second wavelength conversion material for converting the wavelength of the light emitted by said semiconductor light-emitting element to the predetermined wavelength, wherein said groove is provided in said base at a position in which the light emitted by said semiconductor light-emitting element passes through a part of said base and said groove, is converted by the second wavelength conversion material held in said groove to have the predetermined wavelength, and is emitted from a side surface of said base.

2. The light-emitting device according to claim 1, wherein said groove is provided on both sides of said semiconductor light-emitting element.

3. The light-emitting device according to claim 1, wherein said groove is provided around said semiconductor light-emitting element.

4. The light-emitting device according to claim 1, wherein the first wavelength conversion material and the second wavelength conversion material are made of a same material, and said sealing member seals said semiconductor light-emitting element and is filled inside of said groove so that the second wavelength conversion material is held in said groove.

5. The light-emitting device according to claim 1, further comprising a wavelength conversion part provided on the back surface of said base, and including a third wavelength conversion material for converting the wavelength of the light emitted by said semiconductor light-emitting element to the predetermined wavelength.

6. The light-emitting device according to claim 5, wherein said wavelength conversion part is a sintered material film formed on the back surface, and the sintered material film includes the third wavelength conversion material and a binder for sintering made of an inorganic material.

7. The light-emitting device according to claim 5, wherein the first wavelength conversion material, the second wavelength conversion material, and the third wavelength conversion material are phosphor particles which are excited by the light emitted by said semiconductor light-emitting element and emit light.

8. The light-emitting device according to claim 1, wherein a plurality of said semiconductor light-emitting elements are provided on the top surface of said base, and at least part of said groove is extended along a direction in which the plurality of semiconductor light-emitting elements are arranged.

9. A lamp comprising
the light-emitting device according to claim 1.

* * * * *